United States Patent
Yu

(10) Patent No.: US 8,897,645 B2
(45) Date of Patent: Nov. 25, 2014

(54) SYSTEM AND METHOD FOR IMPROVING RECEIVER SENSITIVITY OF A DD-OFDM SYSTEM WITHOUT USING FREQUENCY GUARD BAND

(75) Inventor: Jianjun Yu, Princeton, NJ (US)

(73) Assignee: ZTE (USA) Inc., Iselin, NJ (US)

( * ) Notice: Subject to any disclaimer, the term of this patent is extended or adjusted under 35 U.S.C. 154(b) by 36 days.

(21) Appl. No.: 13/991,068

(22) PCT Filed: Dec. 1, 2010

(86) PCT No.: PCT/CN2010/079316
§ 371 (c)(1),
(2), (4) Date: May 31, 2013

(87) PCT Pub. No.: WO2012/071715
PCT Pub. Date: Jun. 7, 2012

(65) Prior Publication Data
US 2013/0259491 A1 Oct. 3, 2013

(51) Int. Cl.
*H04J 4/00* (2006.01)
*H04L 1/00* (2006.01)
(Continued)

(52) U.S. Cl.
CPC ......... *H04L 1/0011* (2013.01); *H03M 13/2957* (2013.01); *H03M 13/31* (2013.01); *H03M 13/6362* (2013.01); *H04L 1/0013* (2013.01); *H04L 1/0041* (2013.01); *H04L 1/0066* (2013.01); *H04L 1/0068* (2013.01); *H04L 1/04* (2013.01); *H04L 27/2697* (2013.01); *H04L 27/2634* (2013.01)
USPC ................ 398/76; 398/79; 398/193; 398/194

(58) Field of Classification Search
CPC .................................................... H04L 5/0007
USPC .............................. 398/76, 79, 192, 193, 194
See application file for complete search history.

(56) References Cited

U.S. PATENT DOCUMENTS 7,778,350 B2   8/2010   Futagi et al.
8,112,697 B2 *  2/2012  Anand et al. ................. 714/790
(Continued)

FOREIGN PATENT DOCUMENTS

CN   101060382   10/2007
CN   101083512   12/2007
(Continued)

OTHER PUBLICATIONS

Peng et al. OFC/NFOEC 2008, 3 Pages, "Experimental Demonstration of 340 km SSMF Transmission Using a Virtual Single Sideband OFDM Signal that Employs Carrier Suppressed and Iterative Detection Techniques."

(Continued)

*Primary Examiner* — Daniel Dobson
(74) *Attorney, Agent, or Firm* — Brooks Kushman P.C.

(57) ABSTRACT

A system and method for improving receiver sensitivity of an DD-OFDM system without using frequency guard band. The method having: interleaving input data to the DD-OFDM system to generate interleaved data; encoding the input data with a first recursive systematic convolutional code to generate a first recursive systematic convolutional encoded data; encoding the interleaved data with a second recursive systematic convolutional code to generate a second recursive systematic convolutional encoded data; puncturing the first recursive systematic convolutional encoded data and the second recursive systematic convolutional encoded data to generate a parity sequence; and combining the input data with the parity sequence to generate coded DD-OFDM data; wherein the parity sequence is generated by using different puncturing rates for different OFDM subcarriers, so as to obtain higher spectral efficiency.

12 Claims, 4 Drawing Sheets

Principle of interleaver and ACE techniques in an optical DD OFDM system without FGB

(51) Int. Cl.
*H03M 13/29* (2006.01)
*H03M 13/31* (2006.01)
*H03M 13/00* (2006.01)
*H04L 1/04* (2006.01)
*H04L 27/26* (2006.01)
*H04B 10/04* (2006.01)

(56) References Cited

U.S. PATENT DOCUMENTS

| | | | |
|---|---|---|---|
| 2003/0026346 | A1 | 2/2003 | Matsumoto et al. |
| 2007/0121742 | A1 | 5/2007 | Tamaki et al. |
| 2012/0096336 | A1* | 4/2012 | Nakamura et al. ............ 714/790 |
| 2012/0182955 | A1* | 7/2012 | Karaoguz .................... 370/329 |
| 2012/0207242 | A1* | 8/2012 | Maltsev et al. ............... 375/295 |

FOREIGN PATENT DOCUMENTS

| | | |
|---|---|---|
| CN | 101286816 | 10/2008 |
| JP | 2001358596 | 12/2001 |
| JP | 2005295200 | 10/2005 |
| JP | 2007135021 | 5/2007 |
| KR | 2006014103 | 2/2006 |
| WO | 2007037091 | 4/2007 |
| WO | 2009128030 | 10/2009 |

OTHER PUBLICATIONS

International Search Report for PCT/CN2010/079316, Completed by the Chinese Patent Office on Aug. 25, 2011, 3 Pages.
Takahashi., ECOC Sep. 20-24, 2009, Paper 1.3.3, 4 Pages, "Coherent OFDM Transmission with High Spectral Efficiency."
Shieh et al. Optics Express Jan. 21, 2008, vol. 16, No. 2, p. 841-859, "Coherent optical OFDM: theory and design."
Qian et al. Optical Society of America 2009, 3 Pages, "108 Gb/s OFDMA-PON with Polarization Multiplexing and Direct-Detection."
Armstrong., Journal of Lightwave Technology Feb. 1, 2009, vol. 27, No. 3, p. 189-204, "OFDM for Optical Communications."
Jansen et al. ECOC Sep. 21-25, 2008, Mo.3.E.3, 4 Pages, "Optical OFDM, a hype or is it for real".
Qian et al. Optical Society of America 2009, 3 Pages, "Optical OFDM Transmission in Metro/Access Networks."
Lowery et al. Optics Express Mar. 20, 2006, vol. 14, No. 6, p. 2079-2084, "Orthogonal-frequency-division multiplexing for dispersion compensation of long-haul optical systems."
Ali et al. OSA/OFC/NFOEC 2009, 3 Pages, "Spectral Efficiency and Receiver Sensitivity in Direct Detection Optical-OFDM."
Lowery., OFC/NFOEC 2008, 3 Pages, "Improving Sensitivity and Spectral Efficiency in Direct-Detection Optical OFDM Systems."
Cao et al. IEEE Photonics Technology Letters Jun. 1, 2010, Vol. 22, No. 11, p. 736-738, "Direct-Detection Optical OFDM Transmission System Without Frequency Guard Band."
Xu et al. OSA/OFC/NFOEC 2010, 3 Pages, "Spectral-efficient OOFDM system using compatible SSB modulation with a simple dual-electrode MZM."
Hanzo et al. Proceedings of the IEEE Jun. 2007, vol. 95, No. 6, p. 1178-1200, "Turbo Decoding and Detection for Wireless Applications."
Schmidt et al. Journal of Lightwave Technology Jan. 1, 2008, vol. 26, No. 1, p. 196-203, "Experimental Demonstrations of Electronic Dispersion Compensation of Long-Haul Transmission Using Direct-Detection Optical OFDM."
Japanese Office Action for JP 2013-541169, Completed by the Japanese Patent Office on Jun. 19, 2014, 4 Pages.

* cited by examiner

Inter subcarrier interference in an optical DD OFDM system without frequency guard band Principle of interleaver and ACE techniques in an optical DD OFDM system without FGB Experimental setup of an optical DD-OFDM system with ACE and interleaver techniques The BER curves of the received signal for the four types of OFDM signals

SYSTEM AND METHOD FOR IMPROVING RECEIVER SENSITIVITY OF A DD-OFDM SYSTEM WITHOUT USING FREQUENCY GUARD BAND

CROSS-REFERENCE TO RELATED APPLICATION

This application is the U.S. national phase of PCT Application No. PCT/CN2010/079316 filed Dec. 1, 2010, and is incorporated herein by reference.

TECHNICAL FIELD

The present document relates to communication technology, and especially to system and method for improving receiver sensitivity of an optical Direct Detection-Orthogonal frequency division modulation (DD-OFDM) system without using frequency guard band.

BACKGROUND

Orthogonal frequency division modulation (OFDM) is a promising technique in optical fiber communication for its high-spectral efficiency, the ability to combat both chromatic dispersion (CD) and polarization mode dispersion (PMD), and the flexibility in digital signal processing. (Please refer to Jean Armstrong, "OFDM for Optical Communications", JOURNAL OF LIGHTWAVE TECHNOLOGY, VOL. 27, NO. 3, Feb. 1, 2009; Dayou Qian, Neda Cvijetic, Junqiang Hu, Ting Wang "Optical OFDM Transmission in Metro/Access Networks", OSA/OFC/NFOEC 2009, OMV1; A. J. Lowery and J. Armstrong, "Orthogonal-frequency-division multiplexing for dispersion compensation of long-haul optical systems," Opt. Express, vol. 14, no. 6, pp. 2079-2084, 2006; Sander L. Jansen, Itsuro Morita, Kamyar Forozesh, Sebastian Randel, Dirk van den Borneland Hideaki Tanaka, "Optical OFDM, a hype or is it for real?" ECOC 2008, Mo.3.E.3; D. Qian, N. Cvijetic, Junqiang Hu and Ting Wang, "108 Gb/s OFDMA-PON with Polarization Multiplexing and Direct Detection")

In recent years, lots of researches focused on the coherent detection OFDM (CD-OFDM) since it has the advantages of high spectral efficiency, and high receiver sensitivity. However, due to its complex structure and high-bandwidth hardware requirement, it will be very expensive. (Please refer to Hidenori Takahashi, "Coherent OFDM Transmission with High Spectral Efficiency," ECOC 2009, paper 1.3.3; W. Shieh, H. Bao, and Y. Tang, "Coherent optical OFDM: theory and design)

Compared with optical CD-OFDM, optical direct detection (DD) OFDM is a more affordable scheme for its simple receiver. But in order to avoid interferences between the optical carrier and OFDM signals, a spectral-inefficiency frequency guard band (FGB) is needed between the optical carrier and OFDM subcarriers in the traditional optical DD-OFDM, and many investigations have been done for improving the spectral efficiency of the optical DD-OFDM. (Please refer to Wei-Ren Peng1, Xiaoxia Wu, Vahid R. Arbab, Bishara Shamee, Jeng-Yuan Yang, Louis C. Christen1, Kai-Ming Feng, Alan E. Willner and Sien Chi, "Experimental Demonstration of 340 km SSMF Transmission Using a Virtual Single Sideband OFDM Signal that Employs Carrier Suppressed and Iterative Detection Techniques", OFC/NFOEC 2008, OMU1; Abdulamir Ali, Jochen Leibrich and Werner Rosenkranz, "Spectral Efficiency and Receiver Sensitivity in Direct Detection Optical-OFDM", OSA/OFC/NFOEC 2009, OMT7; Arthur James Lowery, "Improving Sensitivity and Spectral Efficiency in Direct-Detection Optical OFDM Systems" OFC/NFOEC 2008, OMM4; Zhenbo Xu, Maurice O'Sullivan and Rongqing Hui, "Spectral-efficient OOFDM system using compatible SSB modulation with a simple dual-electrode MZM" OSA/OFC/NFOEC 2010, OMR2; Zizheng Cao, Jianjun Yu, Wenpei Wang, Lin Chen, and Ze Dong, "Direct-Detection Optical OFDM Transmission System Without Frequency Guard Band", IEEE PHOTONICS TECHNOLOGY LETTERS, VOL. 22, NO. 11, Jun. 1, 2010)

Additionally, Turbo coding can be used to improve the receiver sensitivity, and is used widely in wireless system. (Please refer to Lajos Hanzo, Jason P. Woodard, and Patrick Robertson, "Turbo Decoding and Detection for Wireless Applications")

Therefore, it is desired to improve the receiver sensitivity of the optical DD-OFDM system while obtaining high spectral efficiency with simple architecture.

DISCLOSURE OF THE INVENTION

In the present document, adaptive coding efficiency (ACE) and interleaver techniques without FGB are used in the optical DD-OFDM system, so as to improve the receiver sensitivity while obtaining high spectral efficiency.

An object of the present document is to provide a system for improving receiver sensitivity of a DD-OFDM system without using frequency guard band, the system comprises: an interleaver configured to interleave input data to the DD-OFDM system to generate interleaved data; a first recursive systematic convolutional encoder configured to encode the input data with a first recursive systematic convolutional code to generate a first recursive systematic convolutional encoded data; a second recursive systematic convolutional encoder configured to encode the interleaved data with a second recursive systematic convolutional code to generate a second recursive systematic convolutional encoded data; a puncturing device configured to puncture the first recursive systematic convolutional encoded data and the second recursive systematic convolutional encoded data to generate a parity sequence; and a combiner configured to combine the input data with the parity sequence to generate coded DD-OFDM data; wherein the puncturing device is configured to use different puncturing rates for different OFDM subcarriers to generate the parity sequence, so as to obtain higher spectral efficiency.

In accordance with a certain embodiment of the present document, the puncturing device is further configured to use a higher puncturing rate for OFDM subcarriers with higher bit error rate and use a lower puncturing rate for OFDM subcarriers with lower bit error rate.

In accordance with a further embodiment of the present document, the higher puncturing rate is 0.5 and the lower puncturing rate is 0.25.

In accordance with a still further embodiment of the present document, the OFDM subcarriers with higher bit error rate are 20% of the OFDM subcarriers closer to OFDM carrier.

In accordance with a still further embodiment of the present document, the first recursive systematic convolutional code is 1011 and the second recursive systematic convolutional code is 1101.

Another object of the present document is to provide a method for improving receiver sensitivity of a DD-OFDM system without using frequency guard band, the method comprises: interleaving input data to the DD-OFDM system to generate interleaved data; encoding the input data with a first recursive systematic convolutional code to generate a first recursive systematic convolutional encoded data; encoding the interleaved data with a second recursive systematic convolutional code to generate a second recursive systematic convolutional encoded data; puncturing the first recursive systematic convolutional encoded data and the second recursive systematic convolutional encoded data to generate a parity sequence; and combining the input data with the parity sequence to generate coded DD-OFDM data; wherein in puncturing the first recursive systematic convolutional encoded data and the second recursive systematic convolutional encoded data, the parity sequence is generated by using different puncturing rates for different OFDM subcarriers, so as to obtain higher spectral efficiency.

In accordance with a certain embodiment of the present document, in puncturing the first recursive systematic convolutional encoded data and the second recursive systematic convolutional encoded data, a higher puncturing rate is used for OFDM subcarriers with higher bit error rate and a lower puncturing rate is used for OFDM sub carriers with lower bit error rate.

In accordance with a further embodiment of the present document, the higher puncturing rate is 0.5 and the lower puncturing rate is 0.25.

In accordance with a still further embodiment of the present document, the OFDM subcarriers with higher bit error rate are 20% of the OFDM subcarriers closer to OFDM carrier.

In accordance with a still further embodiment of the present document, the first recursive systematic convolutional code is 1011 and the second recursive systematic convolutional code is 1101.

The receiver sensitivity is improved obviously when the system and the method using ACE and interleaver techniques are utilized.

DETAILED DESCRIPTION OF THE INVENTION

Figure 1:
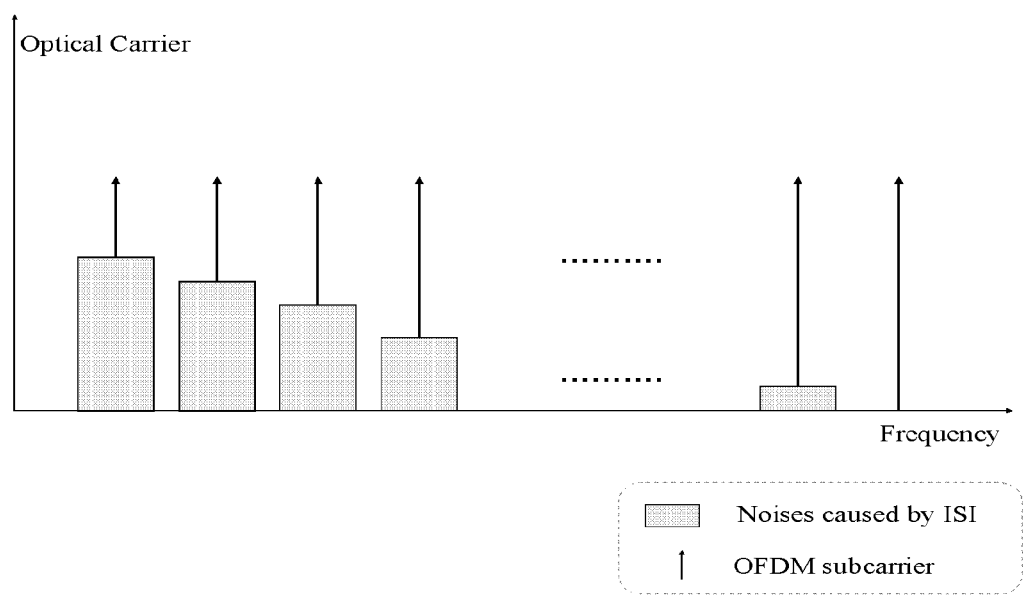
FIG. 1 shows the inter subcarrier interference (ISI) in an optical DD OFDM system without frequency guard band.

In the present document, adaptive coding efficiency (ACE) and interleaver techniques without FGB are used in the optical DD-OFDM system, so as to improve the spectral efficiency while obtaining high spectral efficiency. The inter subcarrier interferences of optical DD-OFDM signal without FBG are investigated theoretically and experimentally. And the experiments show that the receive sensitivity is improved obviously when ACE and interleaver techniques are utilized.

The theory of adaptive coding efficiency (ACE) and interleaver techniques is described below. Firstly, mathematic theory analysis of inter subcarrier interferences is discussed. The Inter Subcarrier Interferences of Optical DD-OFDM Signal without FGB:

The electrical OFDM signal in the time domain can be expressed as:

$$f(t) = \sum_{k=1}^{N}(a_k \cos k\Omega t + b_k \sin k\Omega t) \quad (1)$$

Where N denotes the IFFT size of OFDM signal, k is the number of subcarrier of the OFDM signal, $k\Omega$ is the kth subcarrier of the OFDM signal, and $a_k$, $b_k$ is the in-phase and quadrature components of the kth subcarrier, respectively.

After intensity modulation, the optical OFDM signal without FGB can be expressed as:

$$E_{out}(t) = \left[\sum_{k=1}^{N}(a_k \cos k\Omega t + b_k \sin k\Omega t) + \gamma\right]\cos(\omega_0 t) \quad (2)$$

Where $E_{out}(t)$ is the optical OFDM signal without FGB, $\gamma$ is the optical modulation index of the intensity modulator, and $\cos(\omega_0 t)$ is for the optical carrier, $\omega_0$ is the frequency of the optical carrier. After transmission, a photo-detector was used to convert the optical OFDM signals to the electrical signals at the receiver.

Then the electrical signal I after photo-detector will be:

$$\begin{aligned}
I &= |E_{out}|^2 \quad (3)\\
&= \left(\sum_{k=1}^{N}(a_k \cos k\Omega t + b_k \sin k\Omega t)\cdot \cos\omega_0 t\right)^2 + \gamma^2 \cdot \cos^2\omega_0 t +\\
&\quad 2\gamma \cdot \cos^2\omega_0 t \cdot \sum_{k=1}^{N}(a_k \cos k\Omega t + b_k \sin k\Omega t)\\
&= \frac{1}{2}\left(\sum_{k=1}^{N}(a_k \cos k\Omega t + b_k \sin k\Omega t)\right)^2 + \frac{1}{2}\cdot\\
&\quad \cos 2\omega_0 t \cdot \left(\sum_{k=1}^{N}(a_k \cos k\Omega t + b_k \sin k\Omega t)\right)^2 +\\
&\quad \left(\frac{1}{2}\cdot\gamma^2 + \frac{1}{2}\cdot\gamma^2 \cdot \cos 2\omega_0 t\right) + \gamma \cdot \sum_{k=1}^{N}(a_k \cos k\Omega t + b_k \sin k\Omega t) +\\
&\quad \gamma \cdot \cos 2\omega_0 t \cdot \sum_{k=1}^{N}(a_k \cos k\Omega t + b_k \sin k\Omega t)\\
&= \gamma \cdot \sum_{k=1}^{N}(a_k \cos k\Omega t + b_k \sin k\Omega t) +\\
&\quad \frac{1}{2}\gamma\sum_{k=1}^{N}a_k[\cos(2\omega_0 + k\Omega)t + \cos(2\omega_0 - k\Omega)t] +\\
&\quad \frac{1}{2}\gamma\sum_{k=1}^{N}b_k[\sin(2\omega_0 + k\Omega)t - \sin(2\omega_0 - k\Omega)t] + \frac{1}{2}\cdot\gamma^2 +\\
&\quad \frac{1}{4}\cdot\sum_{k=1}^{N}a_k + \frac{1}{4}\cdot\sum_{k=1}^{N}a_k(\cos 2k\Omega t + \cos 2\omega_0 t) +\\
&\quad \frac{1}{4}\cdot\sum_{k=1}^{N}b_k + \frac{1}{4}\cdot\sum_{k=1}^{N}b_k(\cos 2k\Omega t + \cos 2\omega_0 t) +\\
&\quad \frac{1}{2}\cdot\sum_{k=1}^{N}a_k b_k[\sin(2\omega_0 + 2k\Omega)t + \sin(2k\Omega t)] +
\end{aligned}$$

-continued $$\frac{1}{2} \cdot \sum_{k=1}^{N} a_k b_k [\cos(2\omega_0 t) + \cos(2k\Omega t)] +$$

$$\frac{1}{8} \sum_{\substack{k \neq n \\ k=1, n=1}}^{N} a_k a_n \cos[2\omega_0 t + (n+k)\Omega t] +$$

$$\frac{1}{8} \sum_{\substack{k \neq n \\ k=1, n=1}}^{N} a_k a_n \cos[2\omega_0 t - (n+k)\Omega t] +$$

$$\frac{1}{8} \sum_{\substack{k \neq n \\ k=1, n=1}}^{N} a_k a_n \cos[2\omega_0 t + (n-k)\Omega t] +$$

$$\frac{1}{8} \sum_{\substack{k \neq n \\ k=1, n=1}}^{N} a_k a_n \cos[2\omega_0 t - (n-k)\Omega t] +$$

$$\frac{1}{4} \sum_{\substack{k \neq n \\ k=1, n=1}}^{N} a_k b_n \cos[2\omega_0 t + (n+k)\Omega t] +$$

$$\frac{1}{4} \sum_{\substack{k \neq n \\ k=1, n=1}}^{N} a_k b_n \cos[2\omega_0 t - (n+k)\Omega t] +$$

$$\frac{1}{4} \sum_{\substack{k \neq n \\ k=1, n=1}}^{N} a_k b_n \cos[2\omega_0 t + (n-k)\Omega t] +$$

$$\frac{1}{4} \sum_{\substack{k \neq n \\ k=1, n=1}}^{N} a_k b_n \cos[2\omega_0 t - (n-k)\Omega t] +$$

$$\frac{1}{8} \sum_{\substack{k \neq n \\ k=1, n=1}}^{N} b_k b_n \cos[2\omega_0 t + (n+k)\Omega t] +$$

$$\frac{1}{8} \sum_{\substack{k \neq n \\ k=1, n=1}}^{N} b_k b_n \cos[2\omega_0 t - (n+k)\Omega t] +$$

$$\frac{1}{8} \sum_{\substack{k \neq n \\ k=1, n=1}}^{N} b_k b_n \cos[2\omega_0 t + (n-k)\Omega t] +$$

$$\frac{1}{8} \sum_{\substack{k \neq n \\ k=1, n=1}}^{N} b_k b_n \cos[2\omega_0 t - (n-k)\Omega t] +$$

$$\frac{1}{4} \sum_{\substack{k \neq n \\ k=1, n=1}}^{N} a_k a_n \cos(k-n)\Omega t + \frac{1}{4} \sum_{\substack{k \neq n \\ k=1, n=1}}^{N} a_k a_n \cos(k+n)\Omega t +$$

$$\frac{1}{2} \sum_{\substack{k \neq n \\ k=1, n=1}}^{N} a_k b_n \sin(k-n)\Omega t + \frac{1}{2} \sum_{\substack{k \neq n \\ k=1, n=1}}^{N} a_k b_n \sin(k+n)\Omega t +$$

$$\frac{1}{4} \sum_{\substack{k \neq n \\ k=1, n=1}}^{N} b_k b_n \cos(k-n)\Omega t + \frac{1}{4} \sum_{\substack{k \neq n \\ k=1, n=1}}^{N} b_k b_n \cos(k+n)\Omega t$$

For the nature of the square-law detector, the output contains not only the OFDM signals but also the beating noises due to the inter subcarrier interference (ISI), which will degrade the system performance greatly, as shown in FIG. 1. It is noted that the subcarriers closing to the optical carrier will have bad performance due to the strong ISI. The closer the subcarriers are to the optical carrier, the greater the noises caused by ISI will be.

Therefore, the system performance can be degraded by the inter subcarrier interferences of optical DD-OFDM signal without FGB.

Adaptive Coding Efficiency (ACE) and Interleaver Techniques:

In the present document, adaptive coding efficiency (ACE) and interleaver techniques without FGB are used in the optical DD-OFDM system.

Figure 2:
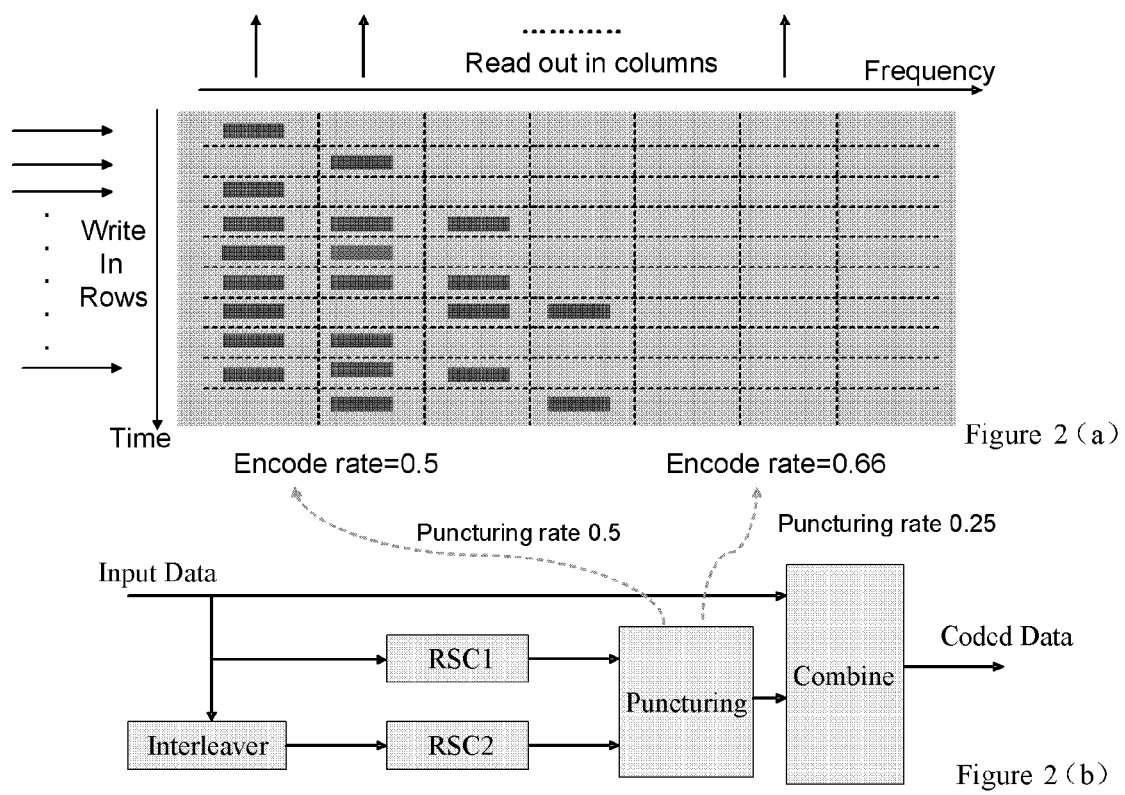
FIG. 2 shows the principle of interleaver and ACE techniques in an optical DD OFDM system without FGB.

FIG. 2 shows the principle of ACE and interleaver techniques in the optical DD-OFDM system without FGB. The solid red rectangles in FIG. 2(a) denote the error bits. Due to the ISI, the performance of the optical DD OFDM without FGB will be degraded. The subcarrier closer to the optical carrier is much easier to be affected by the ISI. In order to disperse these adjacent errors, the bits can be written in rows and can be read out in columns for subcarrier modulation. When the OFDM signals are received, the bits are read out in rows. In this way, the adjacent errors can be dispersed. The digital signal procession described above is about the interleave technique, which is known to the person skilled in communication field.

Since the bit errors are normally concentrated in the OFDM subcarriers which are closer to the optical carrier, there are fewer bit errors in other subcarriers. Therefore, the OFDM subcarriers can be divided into two parts according to the bit error rate (BER): one part with high BER which needs more powerful coding (low coding efficiency), and another part with low BER which may use less powerful coding (high coding efficiency).

The turbo encoder of the present document can improve the receiver sensitivity and obtain the high spectral efficiency by considering the different BERs of the subcarriers. The turbo encoder of the present document is shown in FIG. 2(b). The turbo encoder in FIG. 2(b) uses the ACE and interleaver techniques of the present document. Hereinafter, the turbo encoder using the ACE and interleaver techniques will be described in detail.

The turbo encoder comprises an interleaver, two recursive systematic convolutional (RSC) encoders, a puncturing device, and a combiner. The input data are input to RSC encoder 1, and meanwhile the input data are also input to the interleaver. The processing of the interleaver has been described above with regard to dispersing the adjacent errors. The data output from the interleaver are input to RSC encoder 2. The two RSC encoders use two RSC codes respectively to generate a parity sequence for the input data. One RSC code is used to encode the original input bits, and the other RSC code is used to encode the interleaved bits. The methods to encode the original input bits and the interleaved bits with the two RSC codes are prior art in the wireless system, which will not be discussed in detail. Then the two RSC coded data generated by the two RSC encoders are punctured in the puncturing device to generate the parity sequence for the input data. The turbo coded bits are generated by combining the original input data with the parity sequence generated by the puncturing device.

In certain embodiments of the present document, the RSC codes 1011 and 1101 are used to encode the original input bits and the interleaved bits. Specifically, the RSC code 1011 is used to encode the original input bits, and the RSC code 1101 is used to encode the interleaved bits.

It is noted that the puncturing device in FIG. 2(b) is configured to use different puncturing rates for the above two parts of OFDM subcarriers: one part with higher BER and another part with lower BER. The part of OFDM subcarriers with higher BER is closer to the optical carrier than the part of OFDM subcarriers with lower BER. For the part of OFDM subcarriers with higher BER, a higher puncturing rate should be used. And for the part of OFDM subcarriers with lower BER, a lower puncturing rate should be used. Higher puncturing rate means longer parity sequence. Therefore, the coding efficiency is lower when a higher puncturing rate is used, and the coding efficiency is higher when a lower puncturing rate is used.

In certain embodiments of the present document, the puncturing rates are optimally to be 0.25 and 0.5. When the puncturing rate is 0.25, the coding efficiency is 0.66 (50% overhead), and when the puncturing rate is 0.5, the coding efficiency is 0.5 (100% overhead). In certain embodiments of the present document, about 20% subcarriers in the DD OFDM system apply the coding efficiency of 0.5, while the others apply 0.66. The percentage "20%" can be changed in different circumstance.

The method for improving receiver sensitivity of a DD-OFDM system without using frequency guard band according to the present document can be presented correspondingly. The method comprises:

interleaving input data to the DD-OFDM system to generate interleaved data;

encoding the input data with a first recursive systematic convolutional code to generate a first recursive systematic convolutional encoded data;

encoding the interleaved data with a second recursive systematic convolutional code to generate a second recursive systematic convolutional encoded data;

puncturing the first recursive systematic convolutional encoded data and the second recursive systematic convolutional encoded data to generate a parity sequence; and combining the input data with the parity sequence to generate coded DD-OFDM data;

wherein in puncturing the first recursive systematic convolutional encoded data and the second recursive systematic convolutional encoded data, the parity sequence is generated by using different puncturing rates for different OFDM subcarriers, so as to obtain higher spectral efficiency.

Specifically, in the method according to the present document, a higher puncturing rate is used for OFDM subcarriers with higher bit error rate and a lower puncturing rate is used for OFDM subcarriers with lower bit error rate. The higher puncturing rate may be 0.5 and the lower puncturing rate may be 0.25. The OFDM subcarriers with higher bit error rate may be 20% of the OFDM subcarriers closer to OFDM carrier. More specifically, the first recursive systematic convolutional code is 1011 and the second recursive systematic convolutional code is 1101.

From the embodiments described above, it can be seen that in the present document the technique of using adaptive coding efficiency and the interleaver technique are used together, to improve the receiver sensitivity, while obtaining high spectral efficiency without using FGB. Specifically, the turbo encoder comprising the puncturing device with different puncturing rates and the interleaver implements the ACE and interleaver techniques of the present document. By using the puncturing device with different puncturing rates together with the interleaver for dispersing the adjacent errors, the advantages of improving the receiver sensitivity while obtaining high spectral efficiency without using FGB can be realized. Furthermore, the architecture of the turbo encoder of the present document is simple.

In summary, the overall BER of the whole OFDM signals will be reduced by using the ACE and interleaver techniques of the present document. Therefore, the spectral efficiency is improved by using the ACE and interleaver techniques of the present document without FGB.

Figure 3:
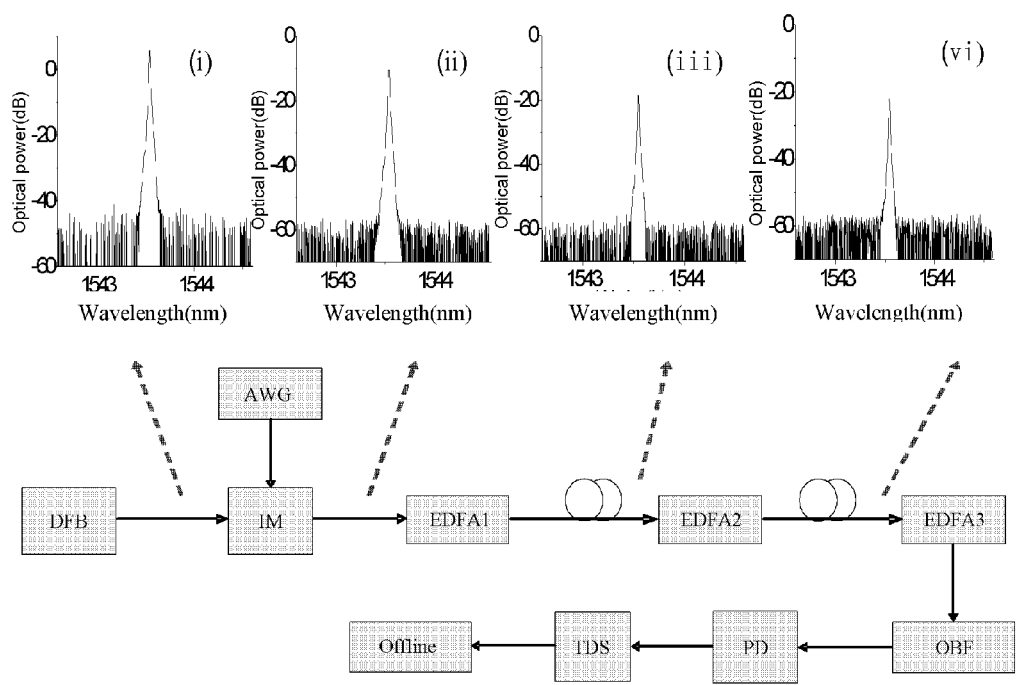
FIG. 3 shows the experimental setup of an optical DD-OFDM system with ACE and Interleaver techniques, in which four types of OFDM signals are used: 5.18 Gb/s OFDM, 5.18 Gb/s turbo coded OFDM, 5.18 Gb/s OFDM with ACE, and 5.18 Gb/s OFDM with ACE and Interleaver.

Experimental Results by Using the ACE and Interleaver Techniques:

FIG. 3 shows the experimental setup of optical DD-OFDM system with ACE and interleaver techniques. The electrical 64QAM-OFDM signals are generated by one commercial arbitrary waveform generator (AWG). The IFFT size of the OFDM signals is 256, wherein 8 subcarriers are used for pilots, 56 subcarriers are used for guard interval and 192 subcarriers are used for data.

In the experiment, four types of OFDM signals are used: 5.18 Gb/s OFDM, 5.18 Gb/s turbo coded OFDM, 5.18 Gb/s OFDM with ACE, and 5.18 Gb/s OFDM with ACE and interleaver. When using the signal-5.18 Gb/s OFDM with ACE and interleaver, the turbo coded rate or efficiency for the subcarriers closer to the optical carrier is 0.5, and for other subcarriers is 0.66.

The lightwave generated from the distributed feedback (DFB) laser is modulated in the intensity modulator (IM) by one Mach-Zehnder modulator (MZM) driven by the generated electrical OFDM signals to generate the four optical OFDM signals. The optical OFDM signals are transmitted over 100 km standard single mode fiber (SSMF) after an erbium doped fiber amplifier (EDFA)1, and then another 100 km SSMF after an EDFA2. In the receiver, before the optical OFDM signals transmitting to photodiode (PD), an EDFA3 and an optical band filter (OBF) were used to amplify the signal and filter the noise, respectively. Then, the optical OFDM signals is transmitted to a real-time digital signal oscilloscope (TDS), after which offline procession will be implemented on the optical OFDM signals.

As shown in FIG. 3, the four graphs are measured before IM, EDFA1, EDFA2, and EDFA3, respectively.

Figure 4:
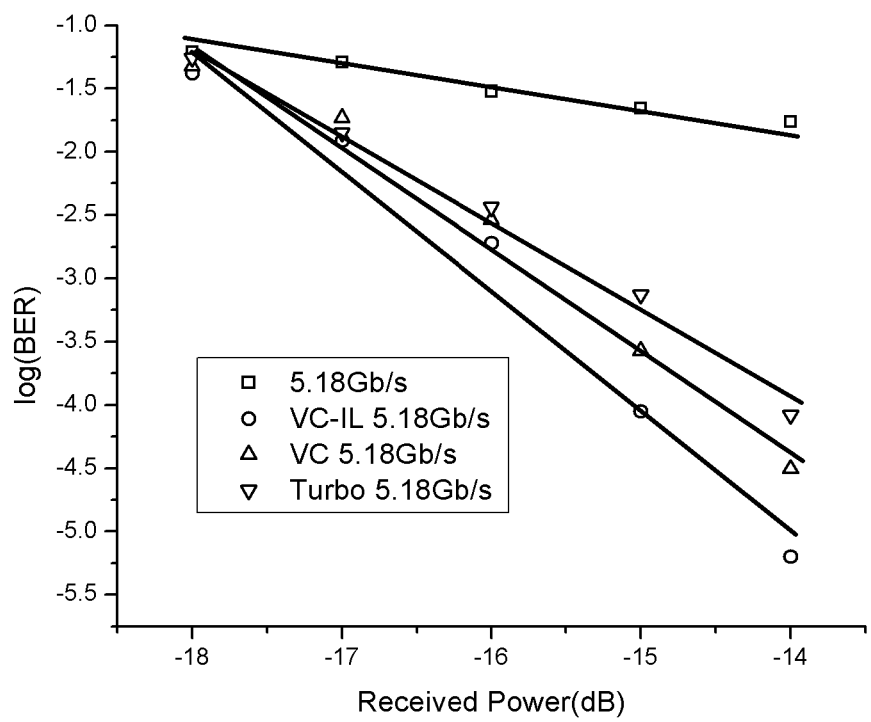
FIG. 4 shows the bit error rate (BER) curves of the received signal for the four types of OFDM signals.

The measured BER curves for the four types of OFDM signals are shown experimentally in FIG. 4. The curves in FIG. 4 are measured before DFA3 of FIG. 3. In FIG. 4, the four curves represent the four types of OFDM signals respectively. It is noted that in FIG. 4, VC means variable coding rate, and VC-IL means variable coding rate-interleaver. After transmission over 200 km SSMF, the receiver sensitivity of the optical DD-OFDM signal with ACE and interleaver is improved more than 1 dB compared with the receiver sensitivity of the turbo coded optical DD-OFDM signal, and is improved more than 5 dB compared with the receiver sensitivity of the optical DD-OFDM signal at the BER of 1×10−4.

From FIG. 4, it can be seen that ACE and interleaver techniques of the present document can be used to improve the performance of the optical DD OFDM signal without FGB. For example, after transmission over 200 km SSMF, the receiver sensitivity of the DD-OFDM system with ACE and interleaver is improved more than 5 dB at the BER of 1×10−4.

In certain embodiments of the present document, the performance of the four non-FGB OFDM signals: 5.18 Gb/s OFDM, 5.18 Gb/s turbo coded OFDM, 5.18 Gb/s OFDM with ACE, and 5.18 Gb/s OFDM with ACE and interleaver are evaluated. The performance of the signal—5.18 Gb/s OFDM with ACE and interleaver is better than the performance of the other three kinds of signals. Therefore, the spectral efficiency can be improved by using the ACE and interleaver techniques of the present document without FGB.

INDUSTRIAL APPLICABILITY

The main advantages of the ACE and interleaver techniques of the present document are to use digital signal procession to improve the receiver sensitivity with very simple architecture while obtaining high spectral efficiency without using FGB.

While embodiment of the present document have been illustrated and described, it is not intended that these embodiments illustrate and describe all possible forms of the present document. Rather, the words used in the specification are words of description rather than limitation, and it is understood that various changes and modifications may be made without departing from the spirit and scope of the present document.

What is claimed is:

1. A system for improving receiver sensitivity of an optical Direct Detection-Orthogonal frequency division modulation (DD-OFDM) system without using frequency guard band, comprising:
    an interleaver configured to interleave input data to the DD-OFDM system to generate interleaved data;
    a first recursive systematic convolutional encoder configured to encode the input data with a first recursive systematic convolutional code to generate a first recursive systematic convolutional encoded data;
    a second recursive systematic convolutional encoder configured to encode the interleaved data with a second recursive systematic convolutional code to generate a second recursive systematic convolutional encoded data;
    a puncturing device configured to puncture the first recursive systematic convolutional encoded data and the second recursive systematic convolutional encoded data to generate a parity sequence; and
    a combiner configured to combine the input data with the parity sequence to generate coded DD-OFDM data;
    wherein the puncturing device is configured to use different puncturing rates for different OFDM subcarriers to generate the parity sequence, so as to obtain higher spectral efficiency.

2. The system of claim 1, wherein the puncturing device is further configured to use a higher puncturing rate for OFDM subcarriers with higher bit error rate and use a lower puncturing rate for OFDM subcarriers with lower bit error rate.

3. The system of claim 2, wherein the higher puncturing rate is 0.5 and the lower puncturing rate is 0.25.

4. The system of claim 3, wherein the OFDM subcarriers with higher bit error rate are 20% of the OFDM subcarriers closer to OFDM carrier.

5. The system of claim 2 or 3, wherein the OFDM subcarriers with higher bit error rate are 20% of the OFDM subcarriers closer to OFDM carrier.

6. The system of claim 1, wherein the first recursive systematic convolutional code is 1011 and the second recursive systematic convolutional code is 1101.

7. A method for improving receiver sensitivity of an optical Direct Detection-Orthogonal frequency division modulation (DD-OFDM) system without using frequency guard band, comprising:
    interleaving input data to the DD-OFDM system to generate interleaved data;
    encoding the input data with a first recursive systematic convolutional code to generate a first recursive systematic convolutional encoded data;
    encoding the interleaved data with a second recursive systematic convolutional code to generate a second recursive systematic convolutional encoded data;
    puncturing the first recursive systematic convolutional encoded data and the second recursive systematic convolutional encoded data to generate a parity sequence; and
    combining the input data with the parity sequence to generate coded DD-OFDM data;
    wherein in puncturing the first recursive systematic convolutional encoded data and the second recursive systematic convolutional encoded data, the parity sequence is generated by using different puncturing rates for different OFDM subcarriers, so as to obtain higher spectral efficiency.

8. The system of claim 7, wherein in puncturing the first recursive systematic convolutional encoded data and the second recursive systematic convolutional encoded data, a higher puncturing rate is used for OFDM subcarriers with higher bit error rate and a lower puncturing rate is used for OFDM subcarriers with lower bit error rate.

9. The system of claim 8, wherein the higher puncturing rate is 0.5 and the lower puncturing rate is 0.25.

10. The system of claim 9, wherein the OFDM subcarriers with higher bit error rate are 20% of the OFDM subcarriers closer to OFDM carrier.

11. The system of claim 8, wherein the OFDM subcarriers with higher bit error rate are 20% of the OFDM subcarriers closer to OFDM carrier.

12. The system of claim 7, wherein the first recursive systematic convolutional code is 1011 and the second recursive systematic convolutional code is 1101.

* * * * *

UNITED STATES PATENT AND TRADEMARK OFFICE
CERTIFICATE OF CORRECTION

| | | |
|---|---|---|
| PATENT NO. | : 8,897,645 B2 | Page 1 of 1 |
| APPLICATION NO. | : 13/991068 | |
| DATED | : November 25, 2014 | |
| INVENTOR(S) | : Yu | |

It is certified that error appears in the above-identified patent and that said Letters Patent is hereby corrected as shown below:

In the claim

Column 9, Line 44, Claim 5:

After "The system of claim"
Delete "2 or 3" and
Insert -- 2 --.

Signed and Sealed this
Twenty-first Day of April, 2015

Michelle K. Lee
*Director of the United States Patent and Trademark Office*